(12) United States Patent
Miyashita

(10) Patent No.: US 9,057,569 B2
(45) Date of Patent: Jun. 16, 2015

(54) CERAMIC HEAT SINK MATERIAL FOR PRESSURE CONTACT STRUCTURE AND SEMICONDUCTOR MODULE USING THE SAME

(75) Inventor: Kimiya Miyashita, Fujisawa (JP)

(73) Assignees: KABUSHIKI KAISHA TOSHIBA, Tokyo (JP); TOSHIBA MATERIALS CO., LTD., Yokohamashi-Shi (JP)

( * ) Notice: Subject to any disclaimer, the term of this patent is extended or adjusted under 35 U.S.C. 154(b) by 0 days.

(21) Appl. No.: 13/988,555

(22) PCT Filed: Nov. 17, 2011

(86) PCT No.: PCT/JP2011/076512
§ 371 (c)(1),
(2), (4) Date: May 21, 2013

(87) PCT Pub. No.: WO2012/070463
PCT Pub. Date: May 31, 2012

(65) Prior Publication Data
US 2013/0241046 A1 Sep. 19, 2013

(30) Foreign Application Priority Data
Nov. 22, 2010 (JP) .................................. 2010-260541

(51) Int. Cl.
*F28F 21/04* (2006.01)
*H01L 23/48* (2006.01)
*H01L 23/373* (2006.01)
(Continued)

(52) U.S. Cl.
CPC ............ *F28F 21/04* (2013.01); *H01L 23/3731* (2013.01); *H01L 23/4006* (2013.01); *H01L 23/433* (2013.01); *H01L 2924/0002* (2013.01)

(58) Field of Classification Search
USPC ................... 257/705, 707, 710, 704, E23.18; 165/85; 438/126; 428/446, 450, 336, 428/141, 195.1, 337
See application file for complete search history.

(56) References Cited

U.S. PATENT DOCUMENTS

| 2011/0017808 A1* | 1/2011 | Eisele et al. ............... 228/173.1 |
| 2012/0119349 A1* | 5/2012 | Naba .............................. 257/704 |
| 2012/0129299 A1* | 5/2012 | Lin et al. ....................... 438/118 |

(Continued)

FOREIGN PATENT DOCUMENTS

| GB | 2 219 133 A | 11/1985 |
| JP | 1985-079752 | 6/1985 |

(Continued)

OTHER PUBLICATIONS

International Preliminary Report on Patentability, including Written Opinion of the International Searching Authority, issued Jun. 12, 2013, in corresponding PCT/JP2011/076512 application. (English Translation provided.).

(Continued)

*Primary Examiner* — Alexander Oscar Williams
(74) *Attorney, Agent, or Firm* — Harness, Dickey & Pierce, PLC

(57) ABSTRACT

A ceramic heat sink material for a pressure contact structure includes a resin layer on a ceramic substrate. The resin layer can have a durometer (Shore) hardness (A-type) of 70 or less, and an average value of gaps existing in an interface between the ceramic substrate and the resin layer is 3 μm or less. The resin layer can be formed by solidifying a thermosetting resin which is fluidized at a temperature of 60° C.

12 Claims, 3 Drawing Sheets

(51) Int. Cl.
*H01L 23/40* (2006.01)
*H01L 23/433* (2006.01)

(56) References Cited

U.S. PATENT DOCUMENTS

2013/0001803 A1* 1/2013 Mengel et al. ............... 257/782
2014/0098588 A1* 4/2014 Kaneko et al. ............... 363/141

FOREIGN PATENT DOCUMENTS

| JP | 01-305548 A | 12/1989 |
|---|---|---|
| JP | 2003-152148 A | 5/2003 |
| JP | 2003-192462 A | 7/2003 |
| JP | 2003-197836 A | 7/2003 |
| JP | 2009-081253 A | 4/2009 |
| JP | 2009-120483 A | 6/2009 |
| WO | WO-2011/010597 A1 | 1/2011 |
| WO | 2012070463 A1 * | 5/2012 |

OTHER PUBLICATIONS

International Search Report (in Japanese with English translation) for PCT/JP2011/076512, mailed Feb. 21, 2012; ISA/JP.

* cited by examiner

CERAMIC HEAT SINK MATERIAL FOR PRESSURE CONTACT STRUCTURE AND SEMICONDUCTOR MODULE USING THE SAME

CROSS-REFERENCE TO RELATED APPLICATIONS

This application is a 371 U.S. National Stage of International Application No. PCT/JP2011/076512, filed on Nov. 17, 2011, which claims priority to Japanese Patent Application No. 2010-260541, filed on Nov. 22, 2010. The contents of the above applications are incorporated herein by reference in their entirety.

TECHNICAL FIELD

The present invention relates to a ceramic heat sink material for a pressure contact structure and a semiconductor module using the ceramic heat sink material, and also relates to a method for manufacturing the semiconductor module.

BACKGROUND ART

Conventionally, a ceramic metal circuit board having an insulation and electrode function has been widely used in a field of mounting power electronics. In such field, a substrate which is mainly composed of alumina ($Al_2O_3$) or aluminum nitride (AlN) as a main component has been conventionally used as a ceramic substrate.

However, since a thermal conductivity of an alumina substrate is as low as about 18 W/m·K, its heat dissipation property (heat radiating property) is insufficient. On the other hand, although the thermal conductivity of an AlN substrate is as high as about 200 W/m·K, the mechanical strength of the AlN substrate is low, and hence its heat-cycle resistance characteristics are insufficient.

To cope with these problems, a high thermal conductive silicon nitride substrate has been developed as a ceramic material having both an excellent thermal conductivity characteristic and an excellent mechanical strength characteristic. For example, Japanese Patent Laid-Open No. 2009-120483 (Patent Document 1) discloses a metal circuit board which is made from silicon nitride ceramic substrate and in which leakage current is reduced by controlling a diameter of pores formed in a grain boundary phase of the silicon nitride ceramic substrate.

Meanwhile, the metal circuit board made from silicon nitride ceramic sintered body is formed by bonding a copper circuit plate to a silicon nitride substrate via (through) an Ag—Cu—Ti-based active metal brazing material. The silicon nitride substrate contains silicon nitride as its main component, and hence has a three-point bending strength as high as 600 MPa or more. For this reason, the bonding structure of the silicon nitride substrate and the copper plate also has excellent heat-cycle resistance characteristics, and hence, even when the bonding structure is subjected to heat cycles for a long period of time, defects, such as a crack and peeling, are hardly caused in the silicon nitride substrate.

For example, Japanese Patent Laid-Open No. 2003-192462 (Patent Document 2) discloses that the metal circuit board made from silicon nitride substrate and obtained according to Patent Document 2 can withstand a heat-cycle resistance test (TCT test) of 3000 cycles.

On the other hand, a bonding process is necessary to form a bonded body of a ceramic substrate and a metal circuit plate, which inevitably results in an increase in manufacturing costs. For this reason, as disclosed in Japanese Patent Laid-Open No. 2003-197836 (Patent Document 3), for the purpose of improving the insulating property, it has been proposed to use a silicon nitride substrate as a spacer for a pressure contact structure. Further, since the silicon nitride substrate has high mechanical strength and a high fracture toughness value, it has been confirmed that the silicon nitride substrate can also sufficiently withstand stress generated in the case where the substrate is applied to a pressure contact structure using screws and the like.

A silicon nitride sintered body, which constitutes the silicon nitride substrate, contains a β-silicon nitride ($\beta$-$Si_3N_4$) as a main phase. A $\beta$-$Si_3N_4$ particle (grain) is a crystal particle having an elongated shape in which the ratio of the major axis length to the minor axis length (aspect ratio) is two or more. In the silicon nitride sintered body, a structure having high mechanical strength and a high fracture toughness value is realized in such a manner that a large number of $\beta$-$Si_3N_4$ particles having an average particle diameter of about 2 to 10 μm are complicatedly entangled with each other.

As described above, the silicon nitride substrate contains $\beta$-$Si_3N_4$ particles as a main phase, and hence microscopic depressions and projections exist on a surface of the silicon nitride substrate. This is caused by the fact that $\beta$-$Si_3N_4$ particles are complicatedly entangled with each other. Even when the surface of the silicon nitride substrate is mirror-polished so as to have a surface roughness Ra of 0.05 μm or less, it is difficult to eliminate these depressions and projections. The mirror polishing process itself also causes an increase in the manufacturing costs.

In a silicon nitride substrate having microscopic depressions and projections described above, especially in a silicon nitride substrate having a projecting portion, there may arise a problem in that, when the silicon nitride substrate is used for a long period of time under application of pressure contact stress, a crack is caused in the silicon nitride substrate with the projecting portion as a starting point.

Further, as described above, the microscopic depressions and projections exist on the surface of the silicon nitride substrate, and hence in the pressure contact structure, microscopic gaps are caused between the silicon nitride substrate and a member (contact member) which is brought into contact with the silicon nitride substrate. The contact member is generally constituted of a metal member, such as a metal plate. Therefore, when gaps are formed between the silicon nitride substrate and the metal member due to the microscopic depressions and projections on the surface of the silicon nitride substrate at the time of forming the pressure contact structure, the gaps impede heat conduction between the silicon nitride substrate and the metal member, which results in a deterioration of heat dissipation characteristics (heat radiation properties) of the pressure contact structure as a module.

CITATION LIST

Patent Literature

Patent Literature 1: Japanese Patent Laid-Open No. 2009-120483
Patent Literature 2: Japanese Patent Laid-Open No. 2003-192462
Patent Literature 3: Japanese Patent Laid-Open No. 2003-197836

SUMMARY OF THE INVENTION

Technical Problem

As described above, microscopic depressions and projections exist on a surface of a conventional silicon nitride substrate. Therefore, when a pressure contact structure is adopted, gaps are easily formed between the silicon nitride substrate and a contact member (pressing member). As a result, when the pressure contact structure is adopted as a module structure body, the gaps cause to increase the heat transfer resistance, so as to deteriorate the heat dissipation property of the module structure body.

Further, the microscopic projecting portion causes the occurrence of a crack at the time when the silicon nitride substrate and the contact member are brought into press-contact with each other. In order to avoid the influence of the crack, it is also conceivable, for example, to increase the thickness of the silicon nitride substrate. However, it is not preferred to increase the thickness of the silicon nitride substrate, because, when the thickness of the silicon nitride substrate is increased, the substrate itself serves as a thermal resistance body.

The present invention has been achieved to solve the above-described problems. An object of the present invention is to provide a silicon nitride insulating substrate (a ceramic heat sink material for a pressure contact structure) which can solve the problem of the gaps formed between the silicon nitride substrate and a contact member due to microscopic depressions and projections formed on the surface of the silicon nitride substrate, and which can reduce the occurrence of a crack due to the microscopic projecting portion formed on the surface of the silicon nitride substrate.

Solution to Problem

A first ceramic heat sink material for a pressure contact structure according to the present invention is featured in that, in a ceramic heat sink material for a pressure contact structure in which a resin layer is provided on a ceramic substrate, the resin layer has durometer (Shore) hardness (A-type) of 70 or less, and in that the average size value of a gap existing in an interface between the ceramic substrate and the resin layer is 3 μm or less.

Further, it is preferred that, in the first ceramic heat sink material for the pressure contact structure, the resin layer is formed by solidifying a thermosetting resin which is fluidized at the temperature of 60° C. Namely, the thermosetting resin exhibits fluidity at the temperature of 60° C.

Further, a second ceramic heat sink material for a pressure contact structure according to the present invention is featured in that, in a ceramic heat sink material for a pressure contact structure in which a resin layer is provided on a ceramic substrate, and the resin layer is formed by solidifying a thermosetting resin which is fluidized at the temperature of 60° C.

Further, it is preferred that, in the second ceramic heat sink material for the pressure contact structure, the resin layer contain inorganic filler particles. Further, it is preferred that the resin layer have durometer (Shore) hardness (A-type) of 10 or more. Further, it is preferred that the ceramic substrate be any one of a silicon nitride substrate, an aluminum oxide substrate, and an aluminum nitride substrate. Further, it is preferred that the thickness of the resin layer be 50 μm or less. Furthermore, it is preferred that the surface roughness Ra of the ceramic substrate be in the range of 0.1 to 5 μm.

Further, the ceramic heat sink material for the pressure contact structure according to the present invention is suitable for a semiconductor module, and is particularly suitable for a semiconductor module in which a pressing member is brought into press-contact with the ceramic heat sink material for forming the pressure contact structure.

Further, it is preferred that the semiconductor module according to the present invention have a portion at which the pressing member is in direct contact with the surface of the ceramic substrate at the time when the pressure contact structure is formed by using the pressing member. Further, it is preferred that the portion at which the pressing member is in direct contact with the surface of the ceramic substrate be a point contact portion having a maximum diameter of 1 mm or less. Further, it is preferred that a plurality of the point contact portions exist.

Advantageous Effects of Invention

In the first ceramic heat sink material for the pressure contact structure according to the present invention, the resin layer having durometer (Shore) hardness (A-type) of 70 or less is provided on the ceramic substrate, and hence the average (height) value of the gaps existing in the interface between the ceramic substrate and the resin layer can be reduced to 3 μm or less.

Further, the second ceramic heat sink material for the pressure contact structure according to the present invention is featured in that, in the ceramic heat sink material for the pressure contact structure in which the resin layer is provided on the ceramic substrate, the resin layer is formed by solidifying the thermosetting resin which is fluidized at the temperature of 60° C.

Thereby, it is possible to prevent the thermal resistance from being increased by the gaps. Further, when the pressure contact structure is formed, microscopic depressions and projections on the surface of the ceramic substrate are covered with the soft resin layer. Thereby, it becomes possible to prevent the occurrence of a crack due to the pressing force acting on the microscopic depressions and projections on the surface of the ceramic substrate.

Further, when the pressure contact structure is formed, the soft resin layer is deformed by the pressing force so as to enable the pressing member to be in direct contact with the ceramic substrate, and hence the excellent heat dissipation property of the ceramic substrate can be effectively utilized.

DESCRIPTION OF EMBODIMENTS

A first ceramic heat sink for a pressure contact structure according to an embodiment of the present invention is featured in that, in a ceramic heat sink material for a pressure contact structure in which a resin layer is provided on a ceramic substrate, the durometer (Shore) hardness (A-type) of the resin layer is 70 or less, and in that the average value (height) of gaps existing in an interface between the ceramic substrate and the resin layer is 3 μm or less.

Figure 1:
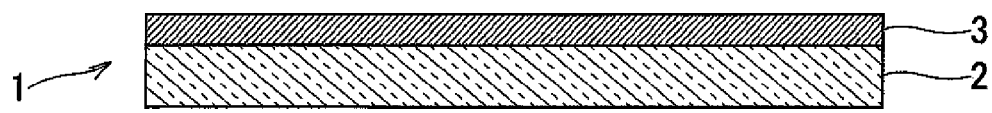
FIG. 1 is a cross-sectional view showing an embodiment of a ceramic heat sink material for a pressure contact structure according to the present invention.
Figure 2:
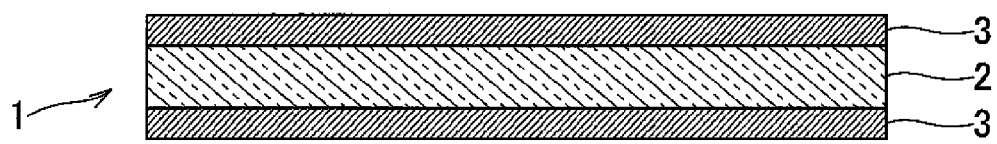
FIG. 2 is a cross-sectional view showing another embodiment of the ceramic heat sink material for the pressure contact structure according to the present invention.
Figure 3:
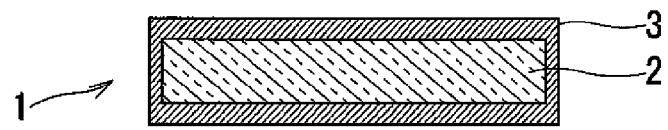
FIG. 3 is a cross-sectional view showing still another embodiment of the ceramic heat sink material for the pressure contact structure according to the present invention.

FIG. 1, FIG. 2 and FIG. 3 are cross-sectional views each showing an example of a ceramic heat sink material for a pressure contact structure according to the present invention. In each of FIG. 1, FIG. 2 and FIG. 3, reference numeral 1 denotes a ceramic heat sink material for a pressure contact structure, reference numeral 2 denotes a ceramic substrate, and reference numeral 3 denotes a resin layer.

As for the arrangement of the resin layer 3, FIG. 1 shows a type in which the resin layer 3 is provided on one surface of the ceramic substrate 2, and FIG. 2 shows a type in which the resin layer 3 is provided on both surfaces of the ceramic substrate 2. However, each of the types may be adopted. The resin layer 3 needs to be provided only on the surface which is to be surely brought into close contact with a pressing member at the time of forming the pressure contact structure. Further, as shown in FIG. 3, the resin layer 3 may also be provided on the whole ceramic substrate 2 so as to surround even side surfaces of the ceramic substrate 2.

Figure 4:
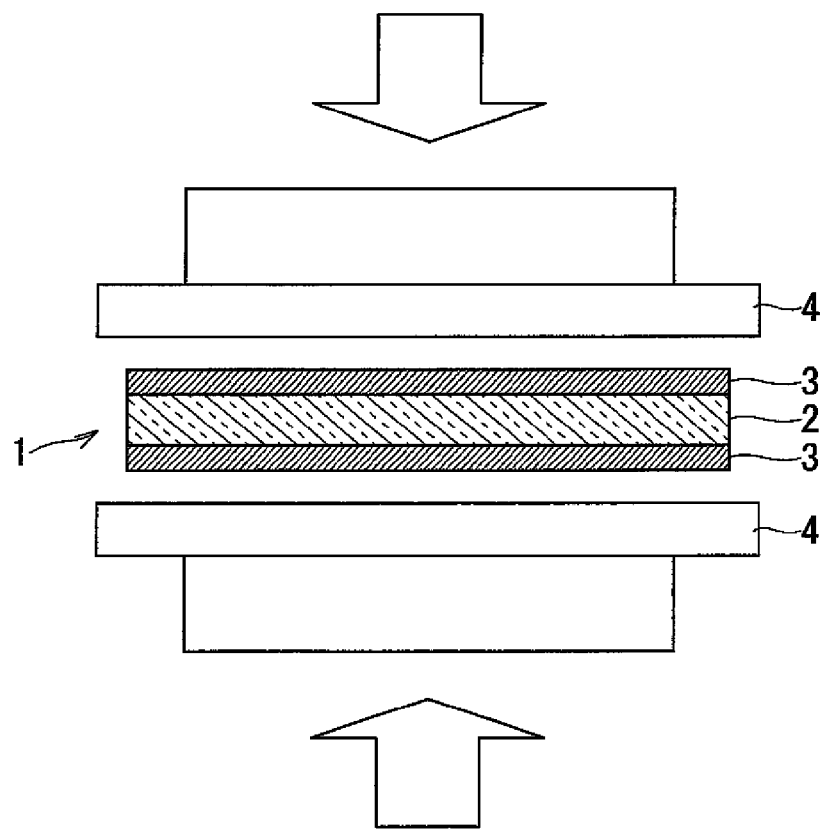
FIG. 4 is a cross-sectional view showing an example of the pressure contact structure.
Figure 6:
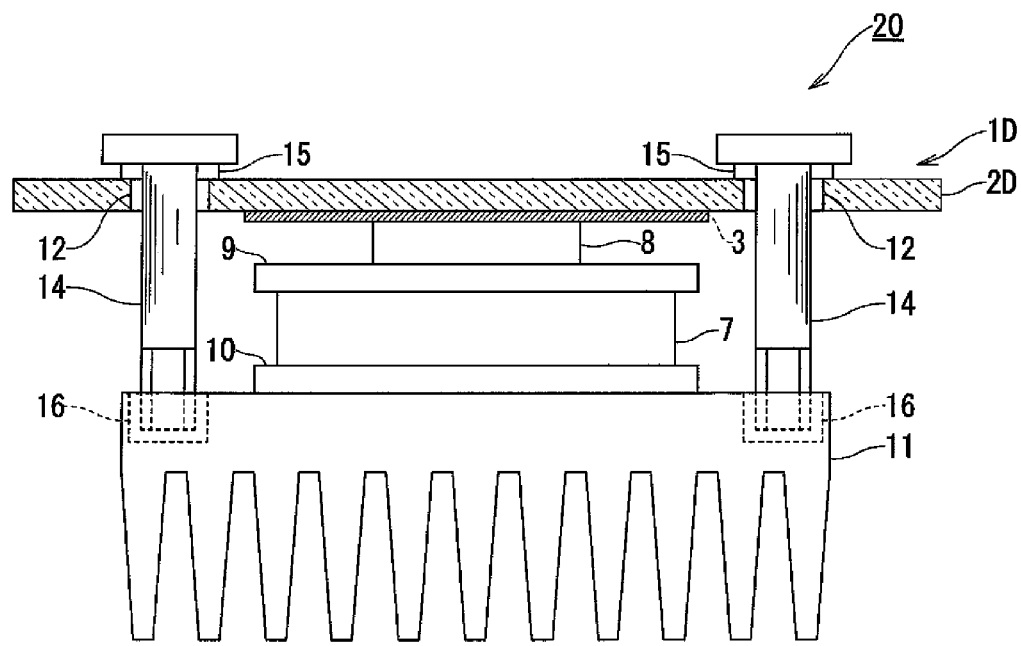
FIG. 6 is a cross-sectional view showing an embodiment of a semiconductor package according to the present invention.

Further, as shown in FIG. 4, it is only necessary that, in the ceramic heat sink material 1 for the pressure contact structure, the resin layers 3 and 3 are respectively provided at portions at which a pressure contact structure is formed, that is, at the portions which are pressed by pressing members 4 and 4. Further, when a pressure contact structure is formed, insertion holes 12 and 12, such as screw holes, may also be provided in the ceramic substrate 2D as shown in FIG. 6.

The ceramic substrate 2 is not limited in particular, but includes substrates, such as an aluminum oxide ($Al_2O_3$) substrate, an aluminum nitride (AlN) substrate, and a silicon nitride ($Si_3N_4$) substrate. Since a pressure contact structure is formed, a ceramic substrate having three-point bending strength of 300 MPa or more is preferred. Further, when the ceramic substrate 2 is used as a heat dissipation (radiating) substrate of a semiconductor module, and the like, it is preferred that the ceramic substrate 2 has a thermal conductivity of 60 W/m·K or more. Examples of ceramic substrates having three-point bending strength of 300 MPa or more and having thermal conductivity of 60 W/m·K or more may include an aluminum nitride substrate and a silicon nitride substrate. Further, when high pressing force is applied to the ceramic substrate, a ceramic substrate having high strength is preferred. Specific examples of such ceramic substrate include a silicon nitride substrate having three-point bending strength of 600 MPa or more.

Further, a resin layer having durometer (Shore) hardness (A-type) of 70 or less is provided on the ceramic substrate. The durometer (Shore) hardness (A-type) is assumed to be measured by a method according to WS-K-6253, in which method the shore hardness is measured by applying a pressing force for one second. The durometer (Shore) hardness (A-type) of 70 or less is described as "A70 or less."

As long as the Shore hardness of the resin layer is A70 or less, the lower limit value of the Shore hardness of the resin layer is not limited in particular. However, it is preferred that the Shore hardness of the resin layer be A10 or more. It is more preferred that the Shore hardness of the resin layer be in the range of A30 to A60. In the case where the Shore hardness of the resin layer is less than A10, the resin layer is too soft, and hence there may be a fear that the resin layer may be broken when the pressing force applied to the resin layer is large at the time of forming a pressure contact structure.

The resin constituting the resin layer is not limited in particular as long as the solidified resin has the Shore hardness of A70 or less, and a thermosetting resin, a photo-curable resin, and the like, can be used as the resin constituting the resin layer. However, it is preferred that the resin constituting the resin layer be a thermosetting resin which is fluidized at the temperature of 60° C. The thermosetting resin which is fluidized at the temperature of 60° C. means a pasty resin which is liquefied at a temperature of 60° C. or more to exhibit fluidity.

When a pressure contact structure is formed by using the thermosetting resin which is fluidized at the temperature of 60° C. or more, the pasty resin is once fluidized by being heated to a temperature of 60° C. or more, and thereby the microscopic depressions and projections on the surface of the ceramic substrate are covered with the fluidized resin. As a result, the average value of the gaps existing in the interface between the ceramic substrate and the resin layer can be further reduced to 1 μm or less (including 0 μm). The composition of the resin is not limited in particular, but examples of the resin exhibiting the above-described characteristics include a phase change material, and the like.

Further, a second ceramic heat sink material for a pressure contact structure according to the present invention is featured in that, in a ceramic heat sink material for a pressure contact structure in which a resin layer is provided on a ceramic substrate, the resin layer is formed by solidifying a thermosetting resin which is fluidized at the temperature of 60° C.

As will be described below, when a semiconductor module provided with a pressure contact structure is manufactured, the second ceramic heat sink material for the pressure contact structure can also be manufactured by applying a method in which, in the pressure contact structure formed by using a pressing member, the resin layer is solidified by being heated.

Further, it is most preferred that the configuration of the first ceramic heat sink material for the pressure contact structure, and the configuration of the second ceramic heat sink material for the pressure contact structure can be both applied, but each of the configurations can be individually applied.

The average value of the gaps existing in the interface between the ceramic substrate and the resin layer is obtained in such a manner that, in an arbitrary cross section of the ceramic heat sink material, an interface between the ceramic substrate and the resin layer is observed over a length of 200 μm, so as to obtain a maximum diameter of the observed gaps, and that an average value of the obtained maximum diameters is set as "the average value of the gaps".

Further, it is preferred that the resin layer contains inorganic filler particles. A resin has high insulating property but has low thermal conductivity, and hence a resin whose thermal conductivity is improved by addition of inorganic filler particles, such as metal powder and ceramic powder, may be used. Examples of the metal powder include Cu powder, Al powder, and the like. Examples of the ceramic powder include AlN powder, $Si_3N_4$ powder, MgO powder, and the like. It is particularly preferred to use AlN (aluminum nitride) powder which is excellent in both the insulating property and the thermal conductivity.

Further, the inorganic filler particle preferably has a particle diameter of ½ or less of the thickness of the resin layer and more preferably has a particle diameter of ⅕ or less of the thickness of the resin layer. In the case where the particle diameter of the inorganic filler particle is large, the filler particles may project from the resin layer, so as to deteriorate the adhesive property (close-contacting property) of the resin layer at the time of forming a pressure contact structure.

It is also preferred that the content rate (addition amount) of the inorganic filler particles be in the range of 20 to 60% by volume. When the content of the inorganic filler particles is less than 20% by volume, the effect of addition of the inorganic filler particles is small. When the content rate of the inorganic filler particles exceeds 60% by volume, the inorganic filler particles may project from a surface of the resin layer, so as to deteriorate the adhesive property of the resin layer at the time of pressure contacting operation. Further, it is preferred that the inorganic filler particles be in a powdered state. Examples of the inorganic filler particles also include fillers having a pointed shape, such as fibrous filler and whisker-like filler. The filler particles having a pointed shape, such as fibrous filler and whisker-like filler can be used depending on the thickness of the resin layer. However, when the pressure contact structure is formed by using the fillers having the pointed shape, and when the fillers are made to project from the surface of the resin layer, the adverse effect (attacking property) of the filler particles on the surfaces of the pressing member and of the ceramic substrate may be increased to cause a crack. Therefore, it is preferred to use the inorganic filler particles in a powdered state.

Further, it is preferred that the thickness of the resin layer be 50 μm or less. Even when the thickness of the resin layer exceeds 50 μm, the gap existing in the interface between the resin layer and the ceramic substrate can be made small. However, when the thickness of the resin layer is too large, the heat dissipation (radiation) property of the resin layer is deteriorated. Therefore, the thickness of the resin layer is preferably 50 μm or less and more preferably 30 μm or less.

Further, the lower limit value of the thickness of the resin layer is not limited in particular, but is preferably 5 μm or more. It is difficult that a resin paste is thinly applied to have a uniform thickness of less than 5 μm. From the manufacturing viewpoint, the lower limit value of the thickness of the resin layer is preferably 5 μm or more, and more preferably 10 μm or more. Note that it is only necessary to control the thickness of the resin layer provided on the surface forming the pressure contact structure.

Further, it is also preferred that the surface roughness Ra of the ceramic substrate be in the range of 0.1 to 5 μm. In order that the resin layer provided on the surface of the ceramic substrate is made to enter between the microscopic depressions and projections on the surface of the ceramic substrate, it is preferred that the surface roughness Ra of the ceramic substrate be 5 μm or less. On the other hand, when the surface roughness Ra of the ceramic substrate is less than 0.1 μm, the surface of the ceramic substrate is too flat, and hence the sufficient anchor effect is not obtained, so that the adhesive property (close-contacting property) of the resin layer may be deteriorated.

Further, the ceramic heat sink material for the pressure contact structure according to the present invention is suitable for a semiconductor module, and is particularly suitable for a semiconductor module in which a pressing member is brought into press-contact with the ceramic heat sink material for the pressure contact structure.

Figure 5:
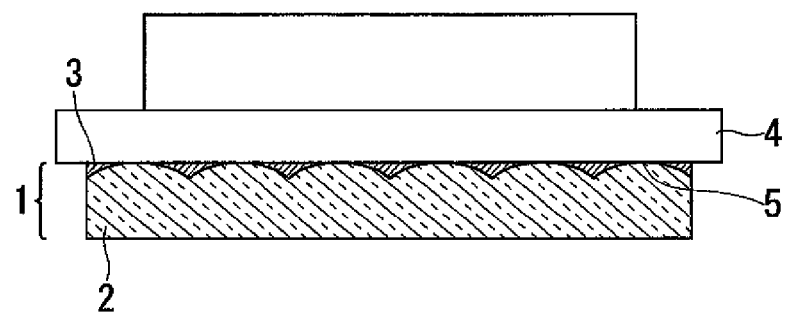
FIG. 5 is a cross-sectional view showing an example of a contact state between a ceramics substrate and a pressing member at the time when a pressure contact structure is formed by the ceramic substrate and the pressing member.

FIG. 4 and FIG. 5 show an example of the pressure contact structure. In FIG. 4 and FIG. 5, a reference numeral 1 denotes the ceramic heat sink for the pressure contact structure, and a reference numeral 4 denotes a pressing member. Further, a reference numeral 5 denotes a portion at which the ceramic substrate 2 and the pressing member 4 are directly contact with each other.

FIG. 4 shows an example of the pressure contact structure, in which the upper and lower surfaces of the ceramic heat sink 1 for the pressure contact structure are pressed and fixed by the pressing members 4 and 4. When the pressure contact structure is formed such that the surfaces of the ceramic substrate 2, on which surfaces the resin layers 3 and 3 are provided, are pressed by the pressing members 4 and 4 as shown in FIG. 4, since the ceramic heat sink 1 for the pressure contact structure according to the present invention is provided with a soft resin layer having Shore hardness of A70 or less, the portions 5, at which the surface of the pressing member 4 and the surface of the ceramic substrate 2 are in direct contact with each other, can be formed as shown in FIG. 5. When the portions 5, at which the pressing member 4 and the ceramic substrate 2 are in direct contact with each other, are provided, heat can be transferred between the pressing member 4 and the ceramic substrate 2 without via the resin layer 3 serving as a thermal resistance body, and hence the heat dissipation property of the ceramic heat sink 1 is improved. That is, the high thermal conductivity of the ceramic substrate 2 can be effectively utilized.

Further, it is preferred that the portion 5, at which the pressing member 4 and the ceramic substrate 2 are in direct contact with each other, be a point contact portion having a maximum diameter of 1 mm or less. As the size of the direct contact portion 5 is increased, the heat dissipation property is improved. However, when the size of the direct contact portion is too large, the occurrence of a crack due to the microscopic depressions and projections existing on the surface of the ceramic substrate in the pressure contact structure cannot be suppressed as in the conventional technique.

That is, the effect of providing the resin layer cannot be obtained. For this reason, the point contact portion has preferably a maximum diameter of 1 mm or less, more preferably a diameter of 0.5 mm or less, and even more preferably a diameter of 0.01 mm or less. Further, the lower limit value of the diameter of the point contact portion is not limited in particular, but is preferably 0.001 mm or more (1 μm or more). It is preferred that a plurality of point contact portions exist. When a plurality of point contact portions having a small diameter exist, it is more possible to obtain a synergistic effect combining the effect of the excellent heat dissipation property of the ceramic substrate and the effect of providing the resin layer.

Figure 7:
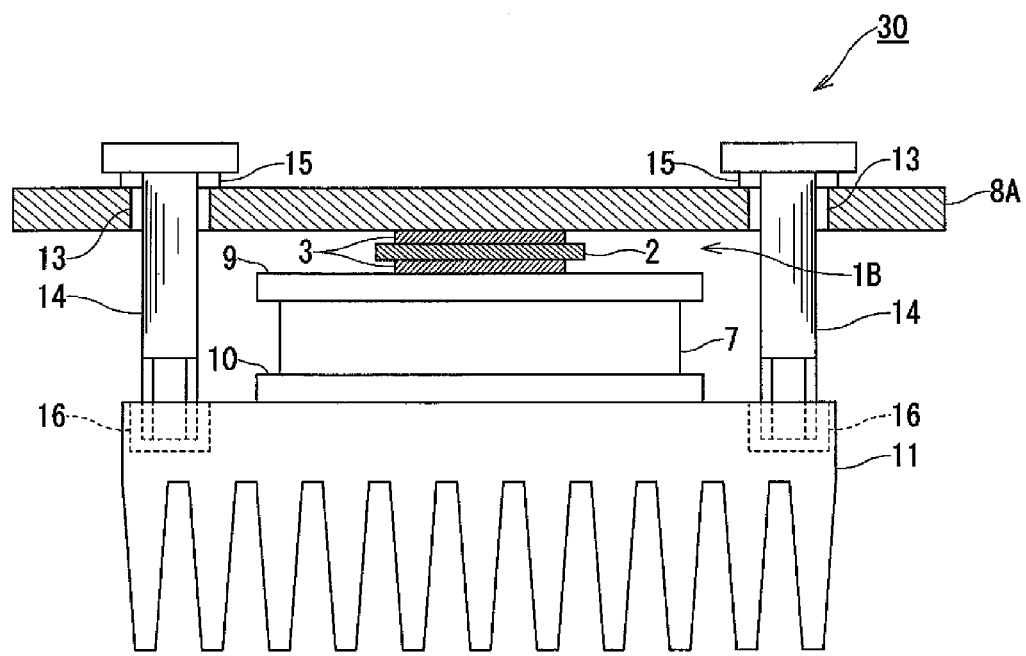
FIG. 7 is a cross-sectional view showing another embodiment of the semiconductor package according to the present invention.

FIG. 6 and FIG. 7 each show an example of a semiconductor package having a pressure contact structure. In FIG. 6 and FIG. 7, reference characters 1D and 1B each denote a ceramic heat sink for a pressure contact structure, reference characters 2 and 2D each denote a ceramic substrate, reference numeral 7 denotes a semiconductor element, reference characters 8 and 8A each denote a pressing member, and reference numerals 9 and 10 each denote an insulating spacer. Further, a reference numeral 11 denotes a heat dissipation member, reference numerals 12 and 13 each denote an insertion hole, reference numeral 14 denotes a fastening member (screw), reference numeral 15 denotes a washer, and reference numeral 16 denotes a hole portion (screw hole).

Further, FIG. 6 shows a structural example in which the resin layer 3 is provided on one surface of the ceramic substrate 2D, and FIG. 7 shows a structural example in which the resin layers 3 and 3 are provided on both surfaces of the ceramic substrate 2.

As shown in FIG. 6, a semiconductor module 20 includes the ceramic heat sink 1D for the pressure contact structure provided with the insertion holes 12 and 12, the plate-like pressing member 8 arranged to face the resin layer 3 of the ceramic heat sink 1D for the pressure contact structure, the semiconductor element 7 arranged on the surface side of the pressing member 8, which surface side is opposite to the side of the ceramic heat sink 1D for the pressure contact structure, the heat dissipation member (heat dissipation fin) 11 which dissipates heat generated in the semiconductor element 7 and which is arranged on the surface side of the semiconductor element 7, the surface side being opposite to the side of the pressing member 8, and the fastening member (screw) 14 for fastening the ceramic heat sink 1D for the pressure contact structure and the heat dissipation member 11.

Further, the plate-like insulating spacer 9 is interposed between one surface of the semiconductor element 7 and the pressing member 8. Further, the plate-like insulating spacer 10 is interposed between the other surface of the semiconductor element 7 and the heat dissipation member 11. Further, the semiconductor element 7 is sandwiched between the insulating spacer 9 and the insulating spacer 10. Further, the insulating spacer 9, the semiconductor element 7, and the insulating spacer 10 are sandwiched between the pressing member 8 arranged to face the insulating spacer 9, and the heat dissipation member 11 arranged to face the insulating spacer 10.

The ceramic heat sink 1D for the pressure contact structure, and the heat dissipation member 11 are fastened to each other by using the fastening member 14. A screw is used as the fastening member 14 in this case, but the fastening member 14 is not limited to the screw as long as it can fasten the ceramic heat sink 1D for the pressure contact structure to the heat dissipation member 11.

In the semiconductor module 20 shown in FIG. 6, when the ceramic heat sink 1D for the pressure contact structure, and the heat dissipation member 11 are fastened to each other by using the fastening member 14, the pressing member 8, the insulating spacer 9, the semiconductor element 7, and the insulating spacer 10, which are arranged between the ceramic heat sink 1D for the pressure contact structure, and the heat dissipation member 11, are pressed to be in contact with each other. In this way, when the fastening members are inserted into the ceramic heat sink 1D for the pressure contact structure, it is only necessary to use the insertion holes 12 and 12 provided in the ceramic substrate 2D.

Note that the pressing member 8 is a plate-like member which is brought into contact with the resin layer 3 of the ceramic heat sink 1D for the pressure contact structure. For example, a metal plate, such as a copper plate, is used as the pressing member 8. The pressing member 8 is interposed between the ceramic heat sink 1D for the pressure contact structure, and the other member, such as the insulating spacer 9. When the ceramic heat sink 1D for the pressure contact structure is fastened to the heat dissipation member 11 by using the fastening member 14, the pressing member 8 is brought into press-contact with the semiconductor element 7 via the insulating spacer 9.

Further, the semiconductor element 7 is a single semiconductor element or an assembly of a plurality of semiconductor elements. The insulating spacer 9 and the insulating spacer 10 are respectively arranged on the upper and lower surfaces of the semiconductor element 7. As the insulating spacers 9 and 10, for example, a plate-like insulator, such as a ceramic substrate, is used.

Further, the heat dissipation member 11 is a member which dissipates heat generated in the semiconductor element 7. The hole portion 16, which can engage a distal end portion of the screw 14 serving as the fastening member, is provided in the upper portion of the heat dissipation member 11 in FIG. 6. As the heat dissipation member 11, for example, a heat dissipation fin is used.

Further, the fastening member 14 is a member for fastening the ceramic heat sink 1D for the pressure contact structure to the heat dissipation member 11. As the fastening member 14, for example, a screw is used.

In the semiconductor module 20 shown in FIG. 6, the ceramic heat sink 1D for the pressure contact structure is fastened to the heat dissipation member 11 in such a manner that a body of the screw 14 serving as the fastening member is inserted into the insertion hole 12 of the ceramic heat sink 1D for the pressure contact structure, and that the distal end portion of the screw 14 is made to engage the hole portion 16 of the heat dissipation member 11.

Further, the washer 15 is interposed between a head portion of the screw 14, and the ceramic heat sink 1D for the pressure contact structure. Thereby, in the semiconductor module 20, the pressing member 8, the insulating spacer 9, the semiconductor element 7, and the insulating spacer 10, which are arranged between the ceramic heat sink 1D for the pressure contact structure, and the heat dissipation member 11, are pressed to be in contact with each other.

When the pressure contact structure as shown in FIG. 6 is formed, the ceramic substrate 2D, on which the soft resin layer 3 having Shore hardness of A70 or less is provided, is strongly brought into press-contact with the surface of the pressing member 8. However, the soft resin layer 3 of the ceramic heat sink 1D for the pressure contact structure covers the microscopic depressions and projections existing on the surface of the ceramic substrate 2D, and hence the ceramic heat sink 1D for the pressure contact structure can be brought into close contact with the pressing member 8 via the resin layer 3.

Further, when the pressing force at the time of pressure contact is set to 5 MPa or more, the soft resin layer 3 is deformed so that the ceramic substrate and the pressing member can be brought into direct contact with each other. Note that, when the pressing force is excessively large, the ceramic substrate may be broken, and hence a force of 5% or less of the three-point bending strength of the ceramic substrate 2D is set as a measure of the pressing force.

In the pressure contact structure configured as described above, no gap is provided in the interface between the ceramic substrate 2D and the resin layer 3, and hence the insulating property and the heat dissipation property can be improved.

Next, FIG. 7 shows an example of a semiconductor module using a ceramic heat sink 1B for a pressure contact structure in which the resin layers 3 and 3 are provided on both sides of the ceramic substrate 2.

As shown in FIG. 7, a semiconductor module 30 includes the ceramic heat sink 1B for the pressure contact structure, on both upper and lower surfaces of which the resin layers 3 and 3 are respectively provided, the plate-like pressing member 8A arranged to face the resin layer 3 provided on one surface of the ceramic heat sink 1B for the pressure contact structure, the semiconductor element 7 arranged to face the resin layer 3 provided on the other surface of the ceramic heat sink 1B for the pressure contact structure, the heat dissipation member 11 which dissipates heat generated in the semiconductor element 7 and which is arranged on the surface side of the semiconductor element 7, the surface side being opposite to the side of the ceramic heat sink 1B for the pressure contact structure, and the fastening member 14 for fastening the pressing member 8A to the heat dissipation member 11.

The plate-like insulating spacer 9 is interposed between the one surface of the semiconductor element 7 and the pressing member 8A. Further, the plate-like insulating spacer 10 is interposed between the other surface of the semiconductor element 7 and the heat dissipation member 11.

The semiconductor element 7 is sandwiched between the insulating spacer 9 and the insulating spacer 10. Further, the insulating spacer 9, the semiconductor element 7, and the insulating spacer 10 are sandwiched between the ceramic heat sink 1B for the pressure contact structure arranged to face the insulating spacer 9, and the heat dissipation member 11 arranged to face the insulating spacer 10. The pressing member 8A and the heat dissipation member 11 are fastened to each other by using the fastening member 14.

In the semiconductor module 30 shown in FIG. 7, the ceramic heat sink 1B for the pressure contact structure, the insulating spacer 9, the semiconductor element 7, and the insulating spacer 10, which are arranged between the pressing member 8A and the heat dissipation member 11, are pressed to be in contact with each other by fastening the pressing member 8A to the heat dissipation member 11 by using the fastening member 14.

Further, the semiconductor module 30 shown in FIG. 7 is different from the semiconductor module 20 shown in FIG. 6 in that the pressing member 8A provided with the insertion holes 12 is used in place of the ceramic heat sink 1D for the pressure contact structure, and in that the ceramic heat sink 1B for the pressure contact structure provided with the resin layer 3 on each of the upper and lower surfaces thereof is used in place of the pressing member 8.

The other portions of the semiconductor module 30 shown in FIG. 7 are the same as those of the semiconductor module 20 shown in FIG. 6. Therefore, components common to both the semiconductor module 30 shown in FIG. 7 and the semiconductor module 20 shown in FIG. 6 are denoted by the same reference numerals and characters, and detailed description of the structure and operation of each of such components is omitted or simplified.

Further, the shape and size of the insertion hole 13 are not limited in particular as long as the fastening member 14, such as a screw, can be inserted into or engaged with the insertion hole 13. Further, the position and the number of the insertion holes 13 provided in the pressing member 8A are also not limited in particular. When the pressing member 8A is fastened to the heat dissipation member 11 by using the fastening member 14, the pressing member 8A is made to press the other members, such as the insulating spacer 9, via the ceramic heat sink 1B for the pressure contact structure.

The fastening member 14 is a member which fastens the pressing member 8A to the heat dissipation member 11. For example, a screw is used as the fastening member 14.

In the semiconductor module 30 shown in FIG. 7, the ceramic heat sink 1B for the pressure contact structure is fastened to the heat dissipation member 11 in such a manner that the body of the screw 14 serving as the fastening member is inserted into the washer 15 and the insertion hole 13 of the pressing member 8A, and that the distal end portion of the screw 14 is made to engage the hole portion 16 of the heat dissipation member 11. Further, the washer 15 is interposed between the head portion of the screw 14, and the pressing member 8A.

Due to the above pressure contact structure, in the semiconductor module 30, the ceramic heat sink 1B for the pressure contact structure, the insulating spacer 9, the semiconductor element 7, and the insulating spacer 10, which are arranged between the pressing member 8A and the heat dissipation member 11, are pressed to be in contact with each other by the pressure contact structure configured as described above.

At this time, the resin layer 3 provided on one surface of the ceramic heat sink 1B for the pressure contact structure is strongly brought into press-contact with the surface of the pressing member 8A, and also the resin layer 3 provided on the other surface of the ceramic heat sink 1B for the pressure contact structure is strongly brought into press-contact with the surface of the insulating spacer 9.

However, the soft resin layer 3 on the ceramic heat sink 1B for the pressure contact structure covers the microscopic depressions and projections existing on the surface of the ceramic substrate, and hence the ceramic substrate and each of the pressing member 8A and the insulating spacer 9 can be brought into close contact with each other via the resin layer 3.

Further, when the pressing force at the time of pressure contact is set to 5 MPa or more, the soft resin layer is deformed so that the ceramic substrate and the pressing member can be brought into direct contact with each other. Note that, when the pressing force is excessively large, the ceramic substrate may be broken, and hence a force of 5% or less of the three-point bending strength of the ceramic substrate is set as a measure of the pressing force.

In the pressure contact structure configured as described above, no gap is provided in the interface between the ceramic substrate and the resin layer, and hence the insulating property and the heat dissipation property can be effectively improved.

Note that an example of screwing is shown in the semiconductor modules shown in FIG. 6 and FIG. 7, but the fastening member used in the semiconductor module according to the present invention is not limited to the screw. As fastening members other than the screw, it is possible to use a fastening member such as, for example, a clamp which sandwiches the heat dissipation member 11 and the ceramic heat sink for the pressure contact structure, or which sandwiches the heat dissipation member 11 and the pressing member. When a clamp is used as the fastening member in this way, the insertion holes need not be provided in the ceramic heat sink for the pressure contact structure and the pressing member.

Further, in the semiconductor module according to the present invention, a member which can dissipate heat generated in the semiconductor module may also be used as a heat dissipation member other than the heat dissipation fin. For example, a heat dissipation sheet, and the like, can be used as the heat dissipation member. When the heat dissipation sheet is used as the heat dissipation member in this way, it is possible to form a semiconductor module having a pressure contact structure in such a manner that the heat dissipation sheet and the ceramic heat sink for the pressure contact structure are sandwiched using, for example, a clamp serving as the fastening member or that the heat dissipation sheet and the pressing member are sandwiched using, for example, the clamp. In this case, the insertion holes need not be provided in the ceramic heat sink for the pressure contact structure and the pressing member.

Further, the semiconductor modules 20 and 30 shown in FIG. 6 and FIG. 7 are examples of the semiconductor module according to the present invention. The semiconductor module according to the present invention includes all of the structures in which a semiconductor element is used and in which a ceramic substrate provided with a resin layer, and a pressing member can be brought into press-contact with each other.

Although some embodiments according to the present invention have been described above, these embodiments are presented as examples, and are not intended to limit the scope of the invention. These novel embodiments can be implemented in other various forms, and various abbreviations, exchanges, and changes can be made within a scope not deviating from the essence of the invention. These embodiments and their modifications are included in the scope and the essence of the present invention, and are included in the present invention described in the claims, and the equivalent scope thereof.

Next, a method for manufacturing a ceramic heat sink for a pressure contact structure according to the present invention will be described. The method for manufacturing a ceramic heat sink for a pressure contact structure according to the present invention is not limited in particular, but includes the following method as the method for efficiently manufacturing the ceramic heat sink for the pressure contact structure according to the present invention.

First, a ceramic substrate is prepared. It is preferred that the ceramic substrate has a three-point bending strength of 500 MPa or more, and thermal conductivity of 60 W/m·K or more. It is preferred that the thickness of the ceramic substrate having such properties be in the range of 0.2 to 1.0 mm. When the thickness of the ceramic substrate is less than 0.2 mm, the ceramic substrate may be broken at the time of forming the pressure contact structure. On the other hand, when the thickness of the ceramic substrate exceeds 1.0 mm, the ceramic substrate itself may serve as a thermal resistance body, so as to deteriorate the heat dissipation property thereof.

Further, it is preferred that the surface roughness of the ceramic substrate be in the range of 0.1 to 5 μm (in terms of Ra standard). Therefore, a polishing process, such as honing, is performed as required. In other words, it is not necessary to perform the polishing process in particular as long as the surface roughness Ra of the as-sintered surface of the ceramic substrate is in the range of 0.1 to 5 μm.

Next, a resin paste to be used as the resin layer is prepared. When inorganic filler particles are added to the resin layer, the inorganic filler particles are added to the resin paste. The average particle diameter of the inorganic filler particles is preferably ½ or less of the thickness of the resin layer to be formed, and more preferably ⅕ or less of the thickness of the resin layer to be formed.

The resin layer is formed by applying (coating) the resin paste on the ceramic substrate and solidifying the applied resin paste. When the resin is made from a thermosetting resin, the resin paste is solidified by being heated, while when the resin is made from an ultraviolet curable resin, the resin paste is solidified by being irradiated with ultraviolet rays.

Further, when the resin constituting the resin layer is a thermosetting resin which is fluidized at the temperature of 60° C., the resin paste is left as it is, so as to be naturally dried. In any of these cases, a resin which has Shore hardness of A70 or less after being solidified is used. Further, a resin film may be used as the resin layer as long as the resin film has Shore hardness of A70 or less, and the resin film may be provided on the surface of the ceramic substrate by thermo-compression bonding.

Further, when a semiconductor module is manufactured by forming the pressure contact structure, the ceramic heat sink for the pressure contact structure is pressed by the pressing member so as to be sandwiched between the pressing member and the other member.

Further, when the thermosetting resin, which is fluidized at a temperature of 60° C. or more, is used as the resin layer, the pressure contact structure is formed in such a manner that the thermosetting resin layer, which is fluidized at a temperature of 60° C. or more, is formed on the ceramic substrate, and is then solidified by being subjected to a heat-treatment.

In this method, since the resin layer is once fluidized and then solidified, the resin layer can be filled in the gaps between the pressing member and the ceramic substrate, and hence the gaps existing in the interface between the ceramic substrate and the resin layer can also be eliminated. Further, when this process is performed in vacuum in the mounting process of the semiconductor module, the gaps between the resin layer and the contact member can also be eliminated.

EXAMPLES

Examples 1 to 9 and Comparison Example 1

A silicon nitride substrate having a length of 50 mm, a width of 50 mm, and a thickness of 0.32 mm (thermal conductivity of 90 W/m·K, and three-point bending strength of 600 MPa) was prepared as a ceramic substrate. Next, the surface roughness Ra of the silicon nitride substrate was changed by surface processing, such as honing and polishing using a diamond wheel. A silicone resin layer having Shore hardness of A70 or less after being hardened was formed on each of the surfaces of the silicon nitride substrate surface-processed in this way, and thereby a ceramic heat sink for a pressure contact structure according to each of the examples was prepared.

Further, a ceramic heat sink for a pressure contact structure having the same structure as that of Example 1 except being provided with a resin layer having Shore hardness of A100 was prepared for Comparison Example 1.

The average value of the gaps (voids) existing in the interface between the ceramic substrate and the resin layer was obtained for the ceramic heat sink for the pressure contact structure according to each of the Examples and the Comparison Example. In the measurement method of the average value of the gaps, an arbitrary interface between the ceramic substrate and the resin layer was observed over the length of 200 μm, and a maximum diameter among the gaps observed in the interface was obtained. Then, the average value of the obtained maximum diameters of the gaps was set as "the average value of the gaps."

The measurement results are shown in the Table 1 hereunder.

TABLE 1

| Sample No. | Surface Roughness of Ceramic Substrate Ra (μm) | Resin Layer | | Inorganic Filler Particle | | Average Value of Gaps formed at interface between Ceramic Substrate and Resin Layer (μm) |
| --- | --- | --- | --- | --- | --- | --- |
| | | Shore Hardness (A-type) | Thickness (μm) | Material (Average Diameter: μm) | Addition Amount (Vol. %) | |
| Example 1 | 2 | 50 | 20 | — | None | 2.1 |
| Example 2 | 3 | 70 | 10 | — | None | 2.6 |
| Example 3 | 3 | 60 | 50 | AlN (3 μm) | 20 | 1.7 |

TABLE 1-continued

| Sample No. | Surface Roughness of Ceramic Substrate Ra (μm) | Resin Layer Shore Hardness (A-type) | Resin Layer Thickness (μm) | Inorganic Filler Particle Material (Average Diameter: μm) | Inorganic Filler Particle Addition Amount (Vol. %) | Average Value of Gaps formed at interface between Ceramic Substrate and Resin Layer (μm) |
|---|---|---|---|---|---|---|
| Example 4 | 5 | 10 | 30 | MgO (2 μm) | 30 | 0.2 |
| Example 5 | 1 | 20 | 30 | Cu (5 μm) | 40 | 1.5 |
| Example 6 | 1 | 30 | 15 | AlN (1 μm) | 60 | 1.1 |
| Example 7 | 0.1 | 40 | 20 | AlN (2 μm) | 30 | 1.8 |
| Example 8 | 0.5 | 50 | 30 | MgO (5 μm) | 30 | 2.4 |
| Example 9 | 5 | 50 | 80 | — | None | 2.9 |
| Comparison Example 1 | 2 | 100 | 20 | — | None | 5.7 |

As is apparent from the results shown in Table 1, when the surface roughness Ra was set in the range of 0.1 to 5 μm, it was possible that the average value of the gaps existing in the interface between the ceramic substrate and the resin layer was suppressed to 3 μm or less by providing the resin layer having Shore hardness A70 or less. On the other hand, as shown in Comparison Example 1, a large gap having the average value of 5.7 μm was formed when the hard resin layer having Shore hardness of A100 was provided.

Examples 10 to 12

A silicon nitride substrate having a length of 50 mm, a width of 50 mm, and a thickness of 0.32 mm (thermal conductivity of 80 W/m·K, and three-point bending strength of 700 MPa) was prepared as a ceramic substrate. Next, the surface roughness Ra of the silicon nitride substrate was changed by surface processing, such as honing and polishing using a diamond wheel. A thermosetting resin paste which is fluidized at the temperature of 60° C. was applied (coated) to both surfaces of the silicon nitride substrate.

The applied resin layer was naturally dried to form a resin paste layer. In a state where a copper plate serving as a pressing member was pressed to the resin layer with pressing force of 2 MPa, the resin paste layer was melt by being heated to a temperature of 60 to 120° C. for 15 to 30 minutes, and was then naturally dried and solidified so as to be formed as a resin layer.

For each of Examples 10 to 12, the average value of the gaps existing in the interface between the ceramic substrate and the resin layer was obtained similarly to Example 1. The results are shown in Table 2 hereunder.

TABLE 2

| Sample No. | Surface Roughness of Ceramic Substrate Ra (μm) | Resin Layer Shore Hardness (A-type) | Resin Layer Thickness (μm) | Inorganic Filler Particle Material (Average Diameter: μm) | Inorganic Filler Particle Addition Amount (Vol. %) | Average Value of Gaps formed at interface between Ceramic Substrate and Resin Layer (μm) |
|---|---|---|---|---|---|---|
| Example 10 | 1 | 40 | 30 | — | None | 0 |
| Example 11 | 2 | 50 | 20 | AlN (1 μm) | 25 | 0 |
| Example 12 | 3 | 50 | 40 | AlN (3 μm) | 30 | 0.2 |

As is apparent from the results shown in Table 2, the average value of the gaps existing in the interface between the ceramic substrate and the resin layer could be significantly reduced to 1 μm or less (including zero), because, in the method in which the resin was fluidized and then solidified in a state where the pressure contact structure is formed, the resin was made to enter between the microscopic depressions and projections on the surface of the substrate.

Examples 13 to 16

An aluminum oxide substrate having a length of 50 mm, a width of 50 mm, and a thickness of 0.635 mm (thermal conductivity of 20 W/m·K, and three-point bending strength of 400 MPa) was prepared as each of Examples 13 and 14. On the other hand, an aluminum nitride substrate having a length of 50 mm, a width of 50 mm, and a thickness of 0.635 mm (thermal conductivity of 170 W/m·K, and three-point bending strength of 500 MPa) was prepared as each of Examples 15 and 16.

A resin layer having Shore hardness A70 or less was provided on both surfaces of each of the substrates. For each of Examples 13 to 16, the average value of the gaps existing in the interface between the ceramic substrate and the resin layer was obtained similarly to Example 1. The results are shown in Table 3 hereunder.

TABLE 3

| Sample No. | Surface Roughness of Ceramic Substrate Ra (μm) | Resin Layer Shore Hardness (A-type) | Resin Layer Thickness (μm) | Inorganic Filler Particle Material (Average Diameter: μm) | Inorganic Filler Particle Addition Amount (Vol. %) | Average Value of Gaps formed at interface between Ceramic Substrate and Resin Layer (μm) |
|---|---|---|---|---|---|---|
| Example 13 | 2 | 50 | 20 | — | None | 1.7 |
| Example 14 | 3 | 60 | 50 | MgO (2 μm) | 30 | 2.7 |
| Example 15 | 2 | 30 | 30 | — | None | 1.3 |
| Example 16 | 3 | 35 | 20 | AlN (2 μm) | 30 | 1.5 |

As is apparent from the results shown in Table 3, the average value of the gaps in the interfaces between the ceramic substrate and the resin layer could be significantly reduced to 3 μm or less by forming the resin layer having Shore hardness of A70 or less after solidification of the resin layer.

Examples 17 to 18

A ceramic heat sink material for a pressure contact structure, which was the same as that in Example 2 except that the thickness of the ceramic substrate was changed to 0.20 mm or 1.0 mm, was prepared. Specifically, a silicon nitride substrate having a length of 50 mm, a width of 50 mm, and a thickness of 0.20 mm (thermal conductivity of 90 W/m·K, and three-point bending strength of 600 MPa) was prepared as Example 17. The same measurement as in Example 2 was performed. The measurement results are shown in Table 4 hereunder.

TABLE 4

| Sample No. | Surface Roughness of Ceramic Substrate Ra (μm) | Resin Layer Shore Hardness (A-type) | Resin Layer Thickness (μm) | Inorganic Filler Particle Material (Average Diameter: μm) | Inorganic Filler Particle Addition Amount (Vol. %) | Average Value of Gaps formed at interface between Ceramic Substrate and Resin Layer (μm) |
|---|---|---|---|---|---|---|
| Example 17 | 3 | 70 | 10 | — | None | 2.6 |
| Example 18 | 3 | 70 | 10 | — | None | 2.6 |

As is apparent from the results shown in Table 4, the same characteristics were obtained even when the thickness of the ceramic substrate was changed.

Examples 1A to 18A, Comparison Example 1B, and Comparison Examples 2 to 4

Next, thermal resistance was measured using the ceramic heat sink for the pressure contact structure of each of Examples 1 to 18 and Comparison Example 1.

The measurement of thermal resistance was performed in such a manner that both the upper and lower surfaces of the ceramic heat sink for the pressure contact structure of each of the examples and of the comparison examples were sandwiched by oxygen-free copper blocks each having a diameter of 40 mm and a height of 16 mm, and that a heater was brought into contact with the upper copper block, and also a water-cooled cooling fin was brought into contact with the lower copper block.

In this state, the load of 5 MPa was applied to the copper block, and the temperature of the copper block was maintained at 70° C. by heating the heater. Further, the temperature of the cooling fin was maintained at 30° C. by flowing cooling water through the cooling fin.

The heat flux was calculated from temperatures obtained by providing temperature measuring holes at the upper and lower portions of each of the copper blocks.

Further, for the purpose of comparison, the measurement similar to the measurement performed for the examples was performed for Comparison Example 2 using a silicon nitride substrate which was the same as in Example 1 except that the resin layer was not provided, Comparison Example 3 using an aluminum oxide substrate which was the same as in Example 13 except that the resin layer was not provided, and Comparison Example 4 using an aluminum nitride substrate which was the same as in Example 15 except that the resin layer was not provided. The results are shown in Table 5 hereunder.

TABLE 5

| Sample No. | Ceramic Heat Sink for Pressure Contact Structure | Thermal Resistance [° C./W] |
|---|---|---|
| Example 1A | Example 1 | 0.07 |
| Example 2A | Example 2 | 0.07 |
| Example 3A | Example 3 | 0.12 |
| Example 4A | Example 4 | 0.05 |
| Example 5A | Example 5 | 0.06 |
| Example 6A | Example 6 | 0.04 |
| Example 7A | Example 7 | 0.08 |
| Example 8A | Example 8 | 0.22 |
| Example 9A | Example 9 | 0.30 |
| Example 10A | Example 10 | 0.03 |
| Example 11A | Example 11 | 0.02 |
| Example 12A | Example 12 | 0.03 |
| Example 13A | Example 13 | 0.08 |
| Example 14A | Example 14 | 0.10 |
| Example 15A | Example 15 | 0.08 |
| Example 16A | Example 16 | 0.06 |
| Example 17A | Example 17 | 0.05 |

TABLE 5-continued

| Sample No. | Ceramic Heat Sink for Pressure Contact Structure | Thermal Resistance [° C./W] |
|---|---|---|
| Example 18A | Example 18 | 0.18 |
| Comparison Example 1A | Comparison Example 1 | 0.51 |
| Comparison Example 2 | Example 1 having no Resin Layer | 0.15 |
| Comparison Example 3 | Example 13 having no Resin Layer | 0.15 |
| Comparison Example 4 | Example 15 having no Resin Layer | 0.13 |

As is apparent from the results shown in Table 5, it was confirmed that the ceramic heat sink for the pressure contact structure according to each of the examples has small thermal resistance, and hence has excellent heat dissipation property. This is because the size of the gaps existing in the interface between the ceramic substrate and the resin layer is reduced.

Examples 1B to 18B

Next, a semiconductor module was produced by using the pressure contact structure of each of Examples 1 to 18. The semiconductor module was set to have the structure shown in FIG. 7. The pressing force at the time of screwing was set to 3 MPa.

The durability of each of the semiconductor modules was measured. The durability of each of the semiconductor modules was checked by confirming the occurrence of a crack in the silicon nitride substrate after the silicon nitride substrate was subjected to vibration generated at the time when the semiconductor module structure was continuously reciprocated over a distance of 50 cm at the frequency of 500 times per 1 minute for 100 hours (vibration test).

Further, a maximum diameter of the portion at which each of the ceramic substrates was in direct contact with the pressing member was obtained. The measurement of the maximum diameter was performed in such a manner that the cross section of the ceramic substrate was observed under application of the screw pressing force of 3 MPa, so as to obtain the average value of the gaps. The results are shown in Table 6 hereunder.

TABLE 6

| Sample No. | Ceramic Heat Sink for Pressure Contact Structure | Durability (Crack Generation at Vibration Test) | Maximum Diameter of Portion where Pressing Member is directly contact with Ceramic Substrate (mm) |
|---|---|---|---|
| Example 1B | Example 1 | None | 1.2 |
| Example 2B | Example 2 | None | 1.4 |
| Example 3B | Example 3 | None | 1.0 |
| Example 4B | Example 4 | None | 2.0 |
| Example 5B | Example 5 | None | 2.0 |
| Example 6B | Example 6 | None | 2.5 |
| Example 7B | Example 7 | None | 1.0 |
| Example 8B | Example 8 | None | 0.02 |
| Example 9B | Example 9 | None | 0.01 |
| Example 10B | Example 10 | None | 2.7 |
| Example 11B | Example 11 | None | 3.0 |
| Example 12B | Example 12 | None | 2.7 |
| Example 13B | Example 13 | None | 1.0 |
| Example 14B | Example 14 | None | 1.0 |
| Example 15B | Example 15 | None | 1.4 |
| Example 16B | Example 16 | None | 2.0 |
| Example 17B | Example 17 | None | 1.6 |
| Example 18B | Example 18 | None | 1.3 |

As is apparent from the results shown in Table 6, the semiconductor module according to each of the examples was excellent in durability. Further, the maximum diameter (mm) of the portion at which the ceramic substrate was in direct contact with the pressing member was as small as 1 mm or less. Note that a plurality of portions at which the ceramic substrate was in direct contact with the pressing member were confirmed in any of the examples.

REFERENCE SIGNS LIST 1, 1B, 1D . . . Ceramic heat sink for pressure contact structure
2, 2D . . . Ceramic substrate
3 . . . Resin layer
4 . . . Pressing member
5 . . . Portion at which ceramic substrate surface is in direct contact with pressing member
7 . . . Semiconductor element
8, 8A . . . Pressing member
9, 10 . . . Insulating spacer
11 . . . Heat dissipation member (heat dissipation fin)
12 . . . Insertion hole of ceramic substrate
13 . . . Insertion hole of pressing member
14 . . . Screw (fastening member)
15 . . . Washer
16 . . . Hole portion
20, 30 . . . Semiconductor module

The invention claimed is:

1. A ceramic heat sink material for a pressure contact structure configured by providing a resin layer on a ceramic substrate, which is any one of a silicon nitride substrate, an aluminum oxide substrate, and an aluminum nitride substrate and has a surface roughness Ra in a range of 0.1 to 5 μm and a three-point bending strength of 300 MPa or more, wherein the resin layer has durometer (Shore) hardness (A-type) of 70 or less, and an average value of gaps existing in an interface between the ceramic substrate and the resin layer is 3 μm or less.

2. The ceramic heat sink material for the pressure contact structure according to claim 1, wherein the resin layer is formed by solidifying a thermosetting resin which is fluidized at a temperature of 60° C.

3. The ceramic heat sink material for the pressure contact structure according to claim 1, wherein the resin layer contains inorganic filler particles.

4. The ceramic heat sink material for the pressure contact structure according to claim 1, wherein the resin layer has durometer (Shore) hardness (A-type) of 10 or more.

5. The ceramic heat sink material for the pressure contact structure according to claim 1, wherein a thickness of the resin layer is 50 μm or less.

6. A semiconductor module, wherein a pressing member is brought into press-contact with a ceramic heat sink material for a pressure contact structure according to claim 1.

7. The semiconductor module according to claim 6, wherein a portion at which a surface of the pressing member is in direct contact with a surface of the ceramic substrate is formed at a time when a pressure contact structure is formed by using the pressing member.

8. The semiconductor module according to claim 7, wherein the portion at which the surface of the pressing member is in direct contact with the surface of the ceramic substrate is a point contact portion having a maximum diameter of 1 mm or less.

9. The semiconductor module according to claim 8, wherein a plurality of the point contact portions exist.

10. A semiconductor module comprising:
a ceramic heat sink material for a pressure contact structure configured by providing a resin layer on a ceramic substrate, wherein the resin layer has durometer (Shore) hardness (A-type) of 70 or less, and an average value of gaps existing in an interface between the ceramic substrate and the resin layer is 3 μm or less; and
a pressing member, wherein the pressing member is brought into press-contact with the ceramic heat sink material for the pressure contact structure;
wherein a portion at which a surface of the pressing member is in direct contact with a surface of the ceramic substrate is formed at a time when a pressure contact structure is formed by using the pressing member.

11. The semiconductor module according to claim 10, wherein the portion at which the surface of the pressing member is in direct contact with the surface of the ceramic substrate is a point contact portion having a maximum diameter of 1 mm or less.

12. The semiconductor module according to claim 11, wherein a plurality of the point contact portions exist.

\* \* \* \* \*